United States Patent [19]
Klokocka
[11] Patent Number: 4,733,193
[45] Date of Patent: Mar. 22, 1988

[54] ARRANGEMENT FOR ELIMINATING SIGNAL HUM

[76] Inventor: Jiri Klokocka, Kronovagen 7, S-182 74 Stocksund, Sweden

[21] Appl. No.: 881,360
[22] PCT Filed: Nov. 19, 1985
[86] PCT No.: PCT/SE85/00471
§ 371 Date: Jun. 20, 1986
§ 102(e) Date: Jun. 20, 1986
[87] PCT Pub. No.: WO86/03354
PCT Pub. Date: Jun. 5, 1986

[30] Foreign Application Priority Data

Nov. 21, 1984 [SE] Sweden .............................. 8405878

[51] Int. Cl.[4] .............................................. H03F 1/26
[52] U.S. Cl. .................................... 330/149; 328/165
[58] Field of Search ............... 330/149, 151, 302, 306, 330/85; 328/165, 167

[56] References Cited

U.S. PATENT DOCUMENTS 4,165,492 8/1979 Motola et al. ...................... 328/165
4,328,591 5/1982 Baghdady ....................... 328/165 X
4,379,994 4/1983 Bauman .............................. 330/149

*Primary Examiner*—Eugene R. LaRoche
*Assistant Examiner*—Steven J. Mottola
*Attorney, Agent, or Firm*—Sughrue, Mion, Zinn, Macpeak & Seas

[57] ABSTRACT

A circuit for eliminating signal hum includes, in series, an adder 17, a delay circuit 13, an amplifier 19 and a subtractor 14. Connected in parallel with the delay circuit is a feedback loop having an amplifier 18 connected to one input 172 of the adder. The circuit input 11 is connected to the input of the series coupling, and to an input 142 on the subtractor. The delay circuit has a control input connected to a second signal input, via a synchronizing circuit 16.

13 Claims, 12 Drawing Figures

ARRANGEMENT FOR ELIMINATING SIGNAL HUM

TECHNICAL FIELD

The present invention relates to an arrangement for eliminating signal hum, and more specifically to an arrangement which includes a first signal input through which the signal is fed into the arrangement, a second signal input for feeding into the arrangement a hum signal of the same frequency as the hum frequency, a delay circuit having an input which is connected to the first signal input and an output which is connected to a subtraction circuit, which has a second input connected to the first signal input and an output connected to the output of the device, and a synchronizing circuit which is connected between the second signal input and a control input on the delay circuit.

BACKGROUND PRIOR ART

Disturbances in the form of quasi-stationary tones having an harmonic spectrum, such as hum for example, often create problems. An example of one area in which such problems arise is the field of electronic music. Many electro-mechanical musical instruments, inter alia electric guitars, have magnetic pick-ups which readily capture the magnetic hum-field present in the vicinity of mains supply cables and mains transformers. Some musical instruments have poor mains components, which also results in humming tones from loudspeakers. The cables in the loudspeaker systems of auditoriums are also liable to cause hum in the mains network.

Another area in which such problems arise is that of medical technology, in which extremely weak electric signals from the human body are measured, such as in electrocardiograms for example. Disturbances in the form of mains hum also occur when transmitting electric signals over long distances; in systems which incorporate sensitive transducers; and applications which utilize extremely low voltages or current strengths.

Experience has shown that there are many different ways of attempting to eliminate hum disturbances of the aforesaid kind.

One method in this respect is to remove the source of disturbance, or to rotate the source so as to minimize the hum transmission coupling.

The electrical system may be screened and/or earthed more effectively.

When the signals are transmitted through cables, balanced cables may be used.

Hum which is caused by poor rectifiers in the instrument can be eliminated by re-designing the mains components of the instrument.

The strongest harmonic components of the hum can be cutoff with the aid of high-pass filters Despite these many methods, however, it can still be difficult to eliminate hum to a satisfactory extent. For example, in the case of a guitarist who constantly moves around the stage, it is practically impossible to eliminate hum transmission effectively. In the case of loudspeakers in auditoriums, the cost of changing the wiring system can be very high. Balanced cables will only reduce hum when used together with balanced signal sources and balanced receiver inputs, which impairs flexibility. The cost of re-designing the mains components of an instrument can also be extremely high. In the case of high-pass filtration, the useful signal is also affected and when the hum is rich in harmonics, high order harmonic components are not eliminated.

The object of the present invention is to provide an arrangement with which these and other drawbacks can be overcome.

DISCLOSURE OF THE INVENTION

The delay circuit of the arrangement according to the invention has positive feedback, and means are provided at some location in the feedback loop for limiting the amplitude, the first derivative and optionally also higher order derivatives of the feedback signal.

The arrangement is also constructed so that the strongest hum which can conceivably occur on the signal input of the arrangement is filtered precisely without distortion, and has a relatively wide bandwidth, so that a useful signal can readily overmodulate the same, although the distortion which occurs will be very slight, due to the limitation in the feedback. When the useful signal ceases, the arrangement will rapidly build-up to the curve form of the hum, due to the wide bandwidth and the limitation in the feedback.

The delay circuit may be achieved digitally. In this way, with a feedback factor of one (1) there is obtained a bandwidth of zero. The path of the input signal to the feedback loop is then blocked. A separate circuit controls the filter so that when the useful signal is negligibly low the curve form of the hum downstream of the feedback loop coincides with the curve form of the hum upstream of said loop. This circuit detects the signal present on the output of the whole of the arrangement and the signal from a feedback loop whose feedback factor is less than one. (In this case the bandwidth is relatively narrow.) On the basis of these signals the circuit decides whether the useful component of the signal applied to the input of the arrangement is, compared with the hum component of the signal, of sufficiently low strength to be considered negligibly low. When it is considered to be negligibly low, the separate circuit initiates a control signal sequence which corrects the hum waveform downstream of the feedback loop.

The signal in a digital coupled feedback loop having a feedback factor which is precisely equal to one will circulate regularly at a repetition time equal to the delay time in the loop, thereby giving rise to a stationary, periodic signal which could be generated equally as well by a separate function generator. Thus, another way of producing a hum elimination filter of zero bandwidth is to subtract the curve form of the hum, generated in a digitally controlled function generator, from the input signal. This function generator is then synchronized with the mains frequency and the curve form of its output signal derives from the aforedescribed feedback loop having a feedback factor of less than one. The previously described separate circuit ensures that the curve form of the output signal of the function generator is constant when the useful signal is not negligibly low, in a similar manner to that mentioned in the previous paragraph.

The function of the separate circuit in deciding whether the input signal shall be interpreted as hum or as a useful signal is facilitated when the signal on the output of the whole arrangement and the signal from the feedback having a feedback factor of less than one are each filtered through a respective weighting filter prior to arriving at the separate circuit. The transmission functions of the two weighting filters are determined by the spectrum of the useful signal and the spectrum of the residual hum signal which could not be filtered off completley.

The separate circuit has pre-settable delays for initiation of the control signal sequence and senses several different threshold levels. In addition, its reaction time is ostensibly less than zero. All this so that the probability of a useful signal being interpreted as hum shall be minimal. Noise, distortion and residual hum from both analogue and digital coupled feedback loops and optional digitally controlled function generator can be reduced with a voltage controlled low-pass filter on their outputs.

The limiting frequency of the low-pass filter is controlled by a control circuit which detects voltages upstream and downstream of the low-pass filter. The limiting frequency is adjusted automatically, so that the difference between these two voltages varies around a pre-set threshold value.

The characterizing features of an arrangement according to the invention are set forth in the following claims.

BRIEF DESCRIPTION OF THE DRAWINGS

The invention will now be described in more detail with reference to the accompanying drawings, in which.

PREFERRED EMBODIMENTS

Figure 1:
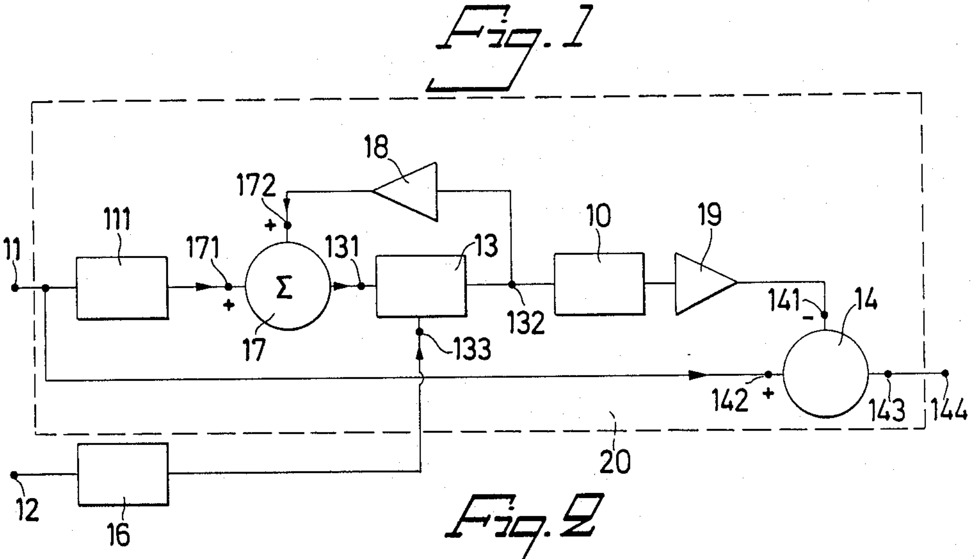
FIG. 1 illustrates an arrangement according to the invention incorporating a single stage.

The arrangement illustrated in FIG. 1 has a signal input 11 to which the signal from which undesirable hum is to be filtered off is applied, and a signal output 144 from which a hum-free signal is transmitted. The arrangement also includes a second signal input 12 to which there is applied a hum signal of the same frequency as one of the partial frequencies of the hum. A low-pass filter 111 is connected between the signal input level and the first signal input 171 of an addition circuit 17. This filter is dimensioned to eliminate that part of the signal whose frequency exceeds half the sampling frequency of a time discrete delay network 13. This network, which is connected between the output of the addition circuit 17 and—over an amplifier 18 having an amplification factor a—its second input 172, delays the signal for a period corresponding to one period of the hum frequency, i.e. the hum obtains the same phase on the output 132 as on the input 131. The network 13 is controlled by a switchable synchronizing circuit 16 (phase locking circuit) which is connected on its input side to the second signal input 12. As a result of addition in the circuit 17 the hum—not the signal in general—obtains a high amplitude (due to the fact that the delay displaces in phase all harmonic components of the hum by 360°) and the hum is thus separated. This hum component is transmitted over a low-pass filter 10 (filtering off frequencies which deviate from the sampling frequency) and an amplifier 19 (damping) to the negative input 141 of a subtraction circuit 14. The signal is fed to the positive input 142 of the substraction circuit 14 directly from the signal input 11, and there is obtained on its output 143 a hum-free signal. By suitable selection of the amplification factor b ($b < b \leqq 1$) of the amplifier 19, the hum components from the inputs 141 and 142 will namely extinguish one another in the circuit 14. With respect to the amplification factors a and b, the amplification factor a will be large when the amplification factor b is small and vice versa. The amplification factor b shall have a value such that hum is completely extinguished in the subtraction circuit 14. The amplification factor a shall have a value such as to obtain a desired Q-value in the feedback circuit.

Figure 5A:
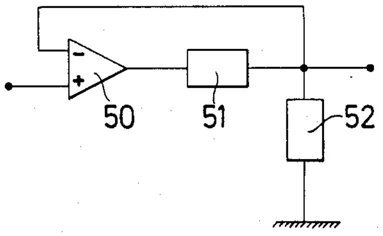
FIGS. 5*a–c* illustrate exemplifying embodiments of limiting circuits which can be coupled in a feedback loop in one of the arrangements according to FIGS. 1–4, 6 and 9.
Figure 5B:
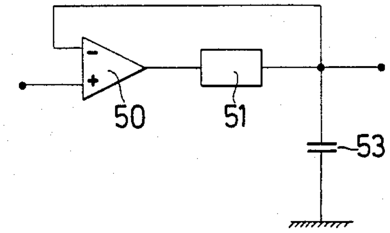
Figure 5C:
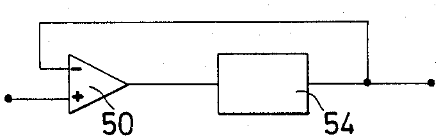

The units 17,13 and 18, which are used together to capture hum, need not be highly dynamic. To avoid disturbing impulse response from transient signals incoming on the input 11, a limiter is suitably connected up to some part of the loop 17-13-18,(e.g. at the location reference 131), although the limiter can also be positioned upstream of the loop or downstream thereof, but upstream of the input 141. FIG. 5 illustrates a number of embodiments of suitable limiters, namely in FIG. 5*a* an amplitude limiter incorporating an operational amplifier 50 and resistor 51,52; in FIG. 5*b* a limiter for limiting the amplitude and first derivative, incorporating the operational amplifier 50, the resistor 51 and a capacitor 53; and in FIG. 5*c* a general limiter for limiting both the amplitude of the signal and also signal derivatives of arbitrary order, incorporating the operational amplifier 50 and a low-pass filter 54.

Figure 2:
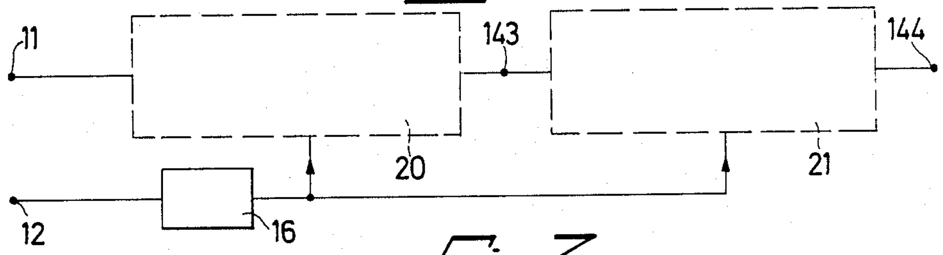
FIG. 2 illustrates an arrangement having two stages according to FIG. 1 connected in cascade.

The arrangement illustrated in FIG. 2 incorporates two stages of the same kind as the stage of the FIG. 1 embodiment, these two stages being coupled sequentially between the input 11 and the output 144 of the arrangement. Both stages are controlled from the synchronizing circuit 16. The requirements with regard to the dynamic range of the combination 17-13-18 are again lower with this arrangement. Lower requirements are also placed on the amplifiers 18 and 19, and the need for trimming certain potentiometers is eliminated. When the Q-value of the first stage 20 is made higher than the Q-value of the second stage 21, and its distortion limit is also made higher, there is achieved a further reduction in impulse response. The impulse response from stage 20 is partially filtered off by the stage 21.

Figure 3:
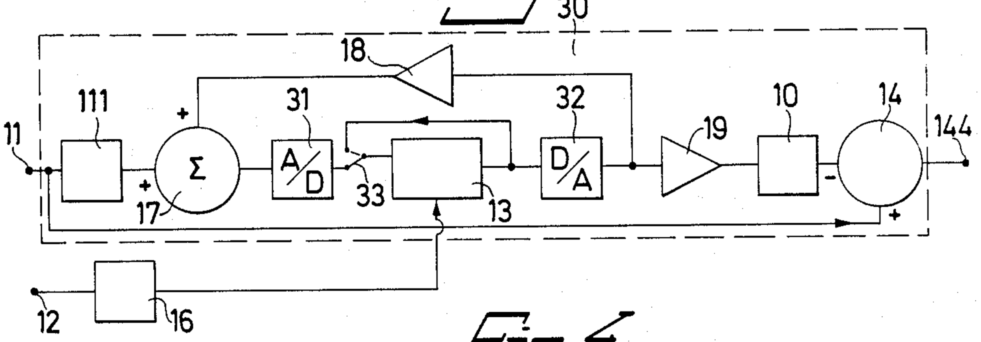
FIG. 3 illustrates an arrangement of the principal construction shown in FIG. 1 but incorporating a digital delay.

The arrangement illustrated in FIG. 3 incorporates a delay circuit 13 arranged for digital delay. Connected to the input and to the output of the delay circuit is a respective analogue/digital converter 31 and a digital-/analogue-converter 32. When a switch 33 occupies its upper, broken-line position the delay circuit 13 is coupled back from the input to the output. When the delay circuit is fed back digitally, the feedback factor is equal to one, which signifies a bandwidth equal to 0. In this way there is obtained an ideal filter which will not affect the useful signal. To enable the filter to build-up, the delay circuit 13 is fed-back first to the analogue side with the switch 33 in its lower, full-line position. The bandwidth is then decreased down to zero with the digital feedback, with the switch 33 in its upper position.

Operation of the switch 33 can be made automatic, by controlling the switch with the aid of a sensing device on the outward side of the arrangement. In the absence of a useful signal, the switch 37 is moved to its lower position, whereupon the filter can build-up to the incoming hum. As soon as a useful signal occurs, the switch 33 is caused to move to its upper position, so that the useful signal does not impair the curve form stored in the delay circuit 13. With regard to the amplification factors a and b the amplification factor a shall have a value such as to obtain a high Q-value.

Figure 4:
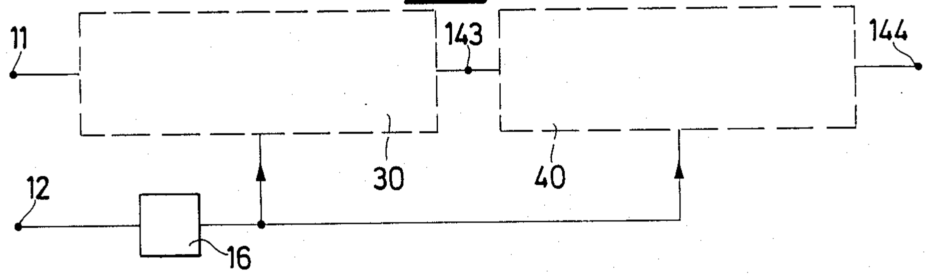
FIG. 4 illustrates an arrangement having two stages according to FIG. 3.

Similar to the arrangement illustrated in FIG. 2, the arrangement in FIG. 4 is divided into two stages 30 and 40, of the same kind as the arrangement according to FIG. 3. The first stage 30 is arranged to operate at high levels, and the absolute error from the converters 31 and 32 is thus high. The second stage 40, operating at low levels, deals with any residual hum, and hence the absolute error from the converters 31 and 32 in this stage is small. The dynamics of the arrangement increase considerably with this construction.

Figure 6:
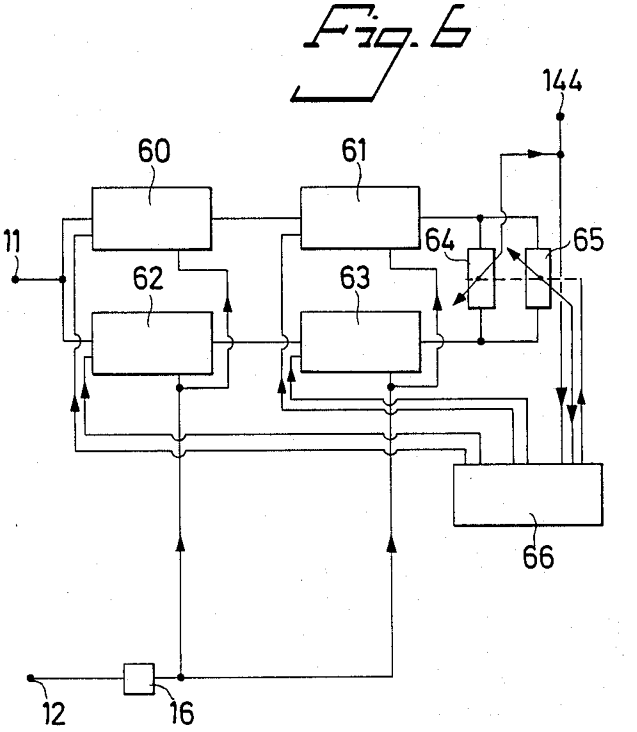
FIG. 6 illustrates an arrangement which comprises two arrangements according to FIG. 4 connected in parallel.

The arrangement illustrated in FIG. 6 incorporates two units according to FIG. 4 connected in parallel, namely the upper unit having circuits. 60-61 and the lower unit having circuits 62-63. During the settling time taken for the one unit, e.g. circuits 60-61, to stabilize for hum elimination, the other unit (the circuits 62-63), has the bandwidth 0 and is connected to the output 144 and to the electronic control means 66, and vice versa, via voltagecontrolled electronic potentiometer 64. The arrangement is, in this may, constantly adjusted correctly to the prevailing hum situation. Switching of the units between respective modes is effected by means of the potentiometer 64, which is controlled by an electronic control means 66. A further voltage-controlled electronic potentiometer 65 transfers the output signal from the unit whose bandwidth is greater than zero to the electronic control means 66.

The voltage-controlled potentiometer can also be achieved with the aid of two voltage-controlled amplifiers and a summator or with the aid of two voltage-controlled impedances.

When the useful signal exceeds a given pre-set value, the unit, e.g. the unit 60-61, which at that moment is building-up, remains disconnected from the signal transfer until the level of the useful signal falls beneath said pre-set level. The other unit 62-63, which then has a zero bandwidth, is connected to the output 144 during the whole of this time period. Thus, when the useful signal contains tones of the same frequencies as the harmonic components of the hum signal over shorter periods of time, these harmonic components are not filtered out.

When this coupling of the two units takes place, the two circuits of the one unit, e.g. the circuits 60 and 61, have a bandwidth greater than 0. The bandwidth of the first circuit (60) drops to zero first, and then the second circuit (61). When the first circuit has a zero bandwidth, its digital distortion spectrum is in harmony with the same fundamental tones as the hum. This enables it to be filtered-off very effectively in the second circuit before the bandwidth thereof decreases to zero.

In order to prevent the arrangement from locking permanently, should for example hum having a level exceeding the pre-set level enter the arrangement, the arrangement is provided with a circuit which senses the signal from the built-up unit, via the potentiometer 61. When the "excessively strong" input signal is truly hum, the level from the built-up unit falls and a time circuit indicates, after a given pre-set time, that the units shall be switched.

Figure 7:
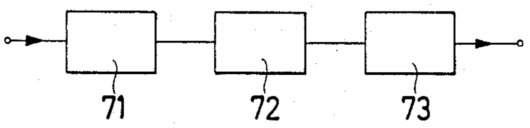
FIG. 7 illustrates a limiting circuit which incorporates a non-linear amplifier.
Figure 8:
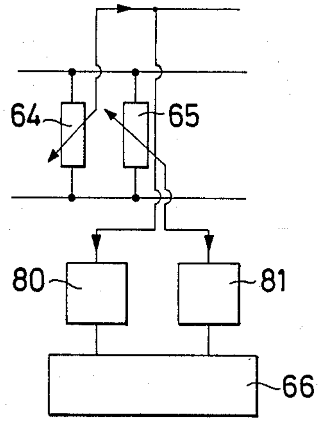
FIG. 8 illustrates certain elements in conjunction with potentiometers incorporated in the arrangement illustrated in FIG. 6.

The limiting circuit illustrated in FIG. 7, which may optionally replace the circuits illustrated in FIG. 5, incorporates an input filter 71, a non-linear circuit 72 and an output filter 73. The filters 71 and 73 are inverse units. The transfer function of the filter 73 shall exhibit high amplification at those frequencies at which the strongest harmonic components of the hum occur. Less disturbing distortion is obtained with this limiting circuit, when the non-linear circuit has a distortion curve whose derivative of at least the second order is limited.

Switching of the units 60-61 and 62-63 is interrupted (as previously described) when the input signal (excluding hum) exceeds a pre-set level. Switching of the units is re-established when the signal has fallen beneath this pre-set level. This re-establishment of the switching mode can be delayed with the aid of a time circuit. Furthermore, the arrangement may be so constructed that switching of the units is delayed only when the signal also exceeds a second level. When the arrangement is constructed in this manner, a slowly decaying signal will not be recognised by the arrangement as hum.

The detail lay-out illustrated in FIG. 1 includes the electronic potentiometer 64 (see FIG. 6) and a weighting filter 80, which is connected on its outward side to the electronic control means 66. This figure also illustrates the electronic potentiometer 65 and a weighting filter 81, which is connected on its outward side to the electronic control means 66.

The frequency characteristic of the filter 80 exhibits high amplification for those frequency bands which are most dominating in the useful signal when said signal is weak, and thus lie close to the threshold level. This reduces the possibility of the arrangement also processing the useful signal when it is weak. The frequency characteristic of the filter 81 gains high attenuation in those frequency bands which are most dominating in the residual hum of the signal from the potentiometer 65 to the electronic control means 66. This residual hum is due to the fact that damping of the unit 60-61, 62-63 is not infinite.

The electronic control means 66 is so constructed that switching of the one unit (e.g. 60-61) which is to be coupled to the output 144 at just that moment is delayed for a given length of time, so that any settling or build-up of the useful signal will not be understood as hum by the control unit 66. In this way an ostensible negative reaction time is obtained.

The synchronizing circuit 66, see FIG. 6, incorporates a phase-locked circuit which functions as a frequency multiplier having a selective multiplication constant. This circuit can be switched to, or replaced with an unsynchronized oscillator of controllable frequency. This enables hum to be filtered-out, even without having access to hum signal on the singal input 12.

Figure 9:
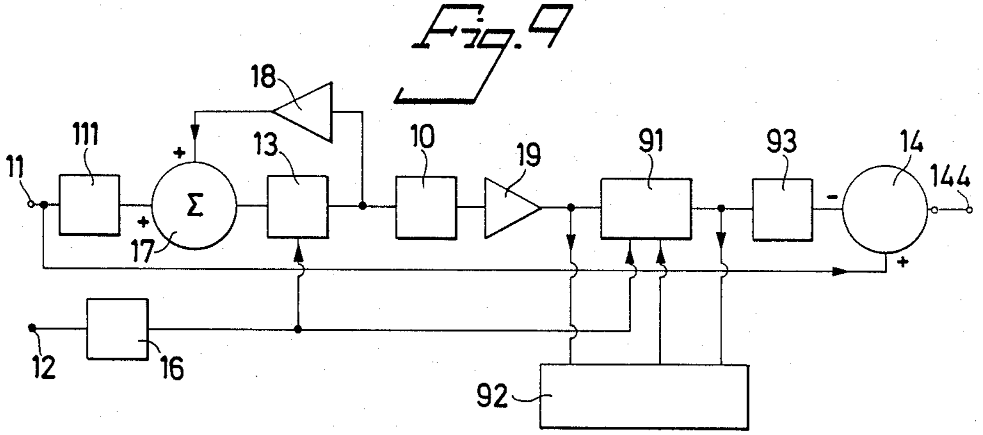
FIG. 9 illustrates an arrangement having zero bandwidth incorporating a digitally controlled function generator.

The arrangement illustrated in FIG. 9 incorporates a digitally controlled function generator 91 instead of the digitally coupled feedback loop. The curve form of the hum is transferred from the amplifier 19 to the function generator 91. The function generator is synchronized with the hum frequency via the synchronizing circuit 16. The output signal from the function generator has the same hum curve-form as that found on the output of the amplifier 19 immediately after the output signal of the amplifier 19 has been transferred to the function generator. Upon completion of this transfer, the curve form on the output of the amplifier 19 can be changed without influencing the curve form from the function generator.

An electronic control means 92 constructed on the same principle as the electronic control means 66 in FIG. 6 detects the signal from a feedback loop, this signal being taken from the output of the amplifier 19, and also detects the signal from the function generator so as to steer when the hum curve form from the amplifier 19 is to be transferred to the function generator, in order to constantly adapt the hum curve-form from the function generator to the prevailing hum situation. A low-pass filter 93 is connected to the output of the function generator for the same purpose as the low-pass filter 10 of the FIG. 1 embodiment.

Figure 10:
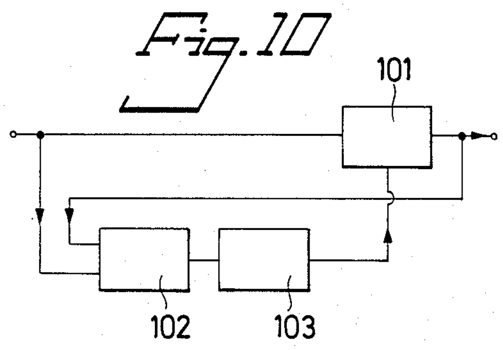
FIG. 10 illustrates an arrangement for reducing hum and distortion from a feedback loop with the aid of a voltage controlled filter.

In order to reduce the high-frequency part of hum, distortion and residual hum from feedback loops which are analogue or digitally coupled, or from the digital function generator, the limit frequency of the low-pass filter 10 and/or 93 should be somewhat higher than the highest disturbing partial frequency of the hum. If this frequency varies radically, a control circuit comprising a comparator 102 and a smoothing circuit 103, see FIG. 10, can be provided to control the limit frequency in a manner to fulfil the above criterium. In this case, the fixed filter 10 and/or 93 has, or have, been replaced with a voltage control filter 101.

I claim:

1. An arrangement for eliminating signal hum, comprising a first signal input (11) for supplying the signal to the arrangement;

a second signal input (12) for supplying to the arrangement a hum signal of the same frequency as one of the partial frequencies of the hum;

a delay circuit (13) having an input (131) connected to the first signal input (11), and an output (132) connected to a substraction circuit (14), which has a second input (142) connected to the first signal input (11), and has an output (143) connected to the output (144) of the arrangement; and a synchronizing circuit (16) between the second signal input (12) and a control input (133) on the delay circuit (13), characterized in that an addition circuit (17) is connected between the first signal input (11) and the input (131) of the delay circuit (13); in that a first amplifier (18) having an. amplification factor a according to the relationship: $0 \leqq a \leqq 1$ is coupled between the output (132) of the delay circuit and the second input (172) of the addition circuit (17); and in that a second amplifier (19) having an amplification factor b according to the relationship $0 \leqq b \leqq 1$ is coupled between the output (132) of the delay circuit (13) and the first input (141) of the subtraction circuit (14).

2. An arrangement according to claim 1, characterized in that a stage (21) similar to the stage (20) between the first input (11) of the arrangement and the output (143) of the subtraction circuit (14) is coupled between the output (143) of the subtraction circuit (14) and the output (144) of the arrangement.

3. An arrangement according to claims 1 or 2, characterized in that the delay circuit (13) is arranged for time discrete delay; and in that a low-pass filter (111 and 10 respectively) is connected between the first signal input (11) and the first signal input (171) of the addition circuit (17), and between the output (132) of the delay circuit (13) and the first input (141) of the subtraction circuit (14).

4. An arrangement according to claims 1 or 2, characterized in that the delay circuit (13) is arranged for digital delay, and has on the input and output thereof a respective analogue/digital converter (31) and a digital-/analogue converter (32).

5. An arrangement according to claims 1 or 2, characterized in that a limiter (50-54, 71-73) effective to limit the amplitude and/or derivative of the hum signal is connected in the circuit between the signal input (11) and the first input (141) of the subtraction circuit (14).

6. An arrangement according to claim 3 characterized in that the arrangement incorporates two units (60-61, 62-63) coupled in parallel, each of said units comprising two mutually similar stages between the first input (11) and the output (144) of the arrangement, these units being capable of being automatically and alternatively connected-up for build-up to a prevailing hum situation and for the transmission of a useful signal respectively.

7. An arrangement according to claim 6, characterized in that for the purpose of switching the units between respective modes there is provided a first voltage-controlled potentiometer (64) having permanent connections to respective output sides of the units (60-61, 62-63) and connected through a variable outlet to the output (144) of the arrangement and to an electronic control means (66); and in that a second voltage-control potentiometer (65) having permanent connections to respective outputs of the units (60-61, 62-63) and connected through a variable outlet to said electronic control means (66) is arranged to transfer output signals from that unit of said parallel-coupled units having a bandwidth greater than 0 at that moment in time.

8. An arrangement according to claim 7, characterized by a sensing circuit (within 66) provided with a time circuit and arranged to detect signals from the second voltage-controlled potentiometer (65) and to switch the units (60-61, 62-63) at a pre-set time after the output level of a selected unit (e.g. 60-61) building-up falls beneath a pre-determined value.

9. An arrangement according to claim 7, characterized in that connected between the variable outlet of the first potentiometer (64) and the electronic control means (66) is a weighting filter (80) having a frequency characteristic which exhibits high amplification for the most dominating frequency and of the useful signal when said signal is weak; and in that connected between the variable outlet of the second potentiometer (65) and the electronic control means (66) is a weighting filter (81) having a frequency characteristic which exhibits high damping for the most dominating frequency band of residual hum in the signal from the potentiometer (65).

10. An arrangement according to claims 1 or 2 characterized in that the synchronizing circuit (16) incorporates a phase-locked circuit arranged to function as a frequency multiplier having a selectable multiplication constant.

11. An arrangement according to claim 1 characterized in that the synchronizing circuit (16) incorporates an asynchronized oscillator having regulatable frequency.

12. An arrangement according to claim 1, characterized in that it includes a digitally controlled function generator (91) connected downstream of the second amplifier (19) and synchronized with hum frequency via the synchronizing circuit (16); and in that an electronic control means (92) is arranged to detect signals in the output of the amplifier (19) and signals on the output of the function generator (91) for controlling infeed of hum signal from the second amplifier (19) to the function generator (91).

13. An arrangement according to claim 1 characterized in that a voltage-control filter (101) is connected between the feedback loop and the first input (141) of the subtraction circuit (14), said filter being arranged to be controlled by a control circuit (102,103) comprising a comparator (102) which has two inputs connected to the input and the output side of the filter (101) respectively, and a smoothing circuit (103) connected on its output side to a control input of the filter (101).

* * * * *